(12) United States Patent
Devarapalli et al.

(10) Patent No.: US 8,920,567 B2
(45) Date of Patent: Dec. 30, 2014

(54) POST METAL CHEMICAL-MECHANICAL PLANARIZATION CLEANING PROCESS

(71) Applicant: International Business Machines Corporation, Armonk, NY (US)

(72) Inventors: Vamsi Devarapalli, Wappingers Falls, NY (US); Colin J. Goyette, Red Hook, NY (US); Michael R. Kennett, Poughkeepsie, NY (US); Mahmoud Khojasteh, Poughkeepsie, NY (US); Qinghuang Lin, Yorktown Heights, NY (US); James J. Steffes, Poughkeepsie, NY (US); Adam D. Ticknor, Wappingers Falls, NY (US); Wei-tsu Tseng, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/786,970

(22) Filed: Mar. 6, 2013

(65) Prior Publication Data

US 2014/0256133 A1  Sep. 11, 2014

(51) Int. Cl.
  *B08B 6/00* (2006.01)
  *B08B 7/00* (2006.01)
  *C25F 1/00* (2006.01)
  *C25F 3/30* (2006.01)
  *H01L 21/02* (2006.01)

(52) U.S. Cl.
  CPC .................. *H01L 21/02068* (2013.01)
  USPC ............. 134/1.3; 438/745; 438/747; 438/754

(58) Field of Classification Search
  None
  See application file for complete search history.

(56) References Cited

U.S. PATENT DOCUMENTS

| | | | |
|---|---|---|---|
| 6,319,833 B1 | 11/2001 | Schonauer et al. | |
| 7,104,267 B2 | 9/2006 | Emami et al. | |
| 7,235,494 B2 * | 6/2007 | Andreas | 438/745 |
| 7,579,279 B2 | 8/2009 | Flake et al. | |
| 8,088,690 B2 | 1/2012 | McDevitt et al. | |
| 8,252,686 B2 | 8/2012 | Park et al. | |
| 8,252,688 B2 | 8/2012 | Shi et al. | |
| 2012/0270401 A1 | 10/2012 | Hou et al. | |
| 2013/0098395 A1 * | 4/2013 | Ding et al. | 134/6 |

* cited by examiner

*Primary Examiner* — Duy Deo
(74) *Attorney, Agent, or Firm* — Scully, Scott, Murphy & Presser, P.C.; Catherine Ivers, Esq.

(57) ABSTRACT

A post metal chemical-mechanical planarization (CMP) cleaning process for advanced interconnect technology is provided. The process, which follows CMP, combines an acidic clean and a basic clean in sequence. The process can achieve a more than 60% reduction in CMP defects, such as polish residues, foreign materials, slurry abrasives, scratches, and hollow metal, relative to an all-basic clean process. The process also eliminates the circular ring defects that occur intermittently during roller brush cleans within a roller brush clean module.

20 Claims, 6 Drawing Sheets

POST METAL CHEMICAL-MECHANICAL PLANARIZATION CLEANING PROCESS

BACKGROUND

The present disclosure relates to semiconductor processing, and more particularly, to a post metal chemical-mechanical planarization (CMP) cleaning process which can be used in advanced interconnect technology.

Defect reduction is perhaps the most critical task in yield and reliability improvement for semiconductor manufacturing. For back-end of the line (BEOL) processes with copper (Cu) interconnects, the defects associated with the chemical-mechanical planarization (CMP) process are quite often the major yield detractor to such an extent that their reduction becomes the most pivotal step in the successful qualification and implementation of the technology.

Since CMP is the final and enabling process before one level of Cu interconnect is fully defined, not only can it generate defects during the process per se (e.g., scratches and polish residues), but it will also reveal defects generated from prior processing steps, such as post-RIE cleaning, liner deposition, and Cu plating. Therefore, not only must the post Cu CMP cleaning process clean up the defects generated by CMP, it must also be sufficiently compatible with prior processes to prevent exacerbating pre-existing defects incoming to CMP.

In principle, a robust post Cu CMP cleaning process removes the polish residues (PR), foreign materials (FM), abrasive particles, or any debris left on the wafer surface as a result of the polish. In addition, a post Cu CMP cleaning process passivates the Cu surface long and effectively enough to inhibit time-dependent Cu corrosion in form of hollow metal (HM) and Cu nodules or dendrites (DE). With the ever shrinking ground rule, new challenges emerge and new types of CMP-related defects are observed in advanced technology nodes such as 32 nm and beyond. Among these, circular ring defects (sometimes referred to as brush scrubbing scratches) are unique in that such defects are generated during the brush cleaning step with distinct concentric circle signatures that follow the path of particles in motion on roller brushes, as shown in FIG. 1.

Small alumina or silica residual abrasive particles in CMP slurries are about 50 nm to 100 nm in diameter and are even more difficult to remove than larger particles due to their higher surface charge to volume ratio. Furthermore, in fine pitch Cu interconnects, the electric potential becomes greater while the diffusion path becomes shorter, creating an environment that will expedite the formation of corrosion-related defects such as HM and DE.

Previous work on post Cu CMP cleaning process includes the optimization of contact kinetics during brush clean to enhance cleaning efficiency and to reduce brush scrubbing scratches. Regarding the clean chemical, the addition of inhibitors, surfactants, or chelating agents is common practice in the industry. Currently, most of the post Cu CMP cleaning chemicals for advanced technology nodes operate in the neutral to high pH regimes in order to achieve acceptable passivation of Cu and prevent corrosion-related defects.

In view of the above, a new post metal CMP cleaning process is needed that overcomes the challenges associated with CMP.

SUMMARY

A post metal chemical-mechanical planarization (CMP) cleaning process which can be used in advanced interconnect (i.e., BEOL) technology is provided. The process of the present disclosure, which follows CMP, combines an acidic clean and a basic clean in sequence. The process of the present disclosure achieves a more than 60% reduction in CMP defects, such as polish residues, foreign materials, slurry abrasives, scratches, and hollow metal, relative to an all-basic clean process. The process of the present disclosure also reduces and, in some instances, eliminates the circular ring defects that occur intermittently during roller brush cleans.

In one aspect of the present disclosure, a method of processing a semiconductor wafer is provided. In accordance with this aspect of the present disclosure, the method includes planarizing a semiconductor wafer containing at least one metal structure. After planarization, the semiconductor wafer is subjected to brush cleaning in an acidic medium. Next, the semiconductor wafer is dipped in a basic medium.

In another aspect of the present disclosure, a method to eliminate metal defects and inhibit dendrite growth on a planarized semiconductor wafer is provided. In accordance with this aspect of the present disclosure, the method includes removing metal oxide particles from a planarized surface of a semiconductor wafer containing at least one metal structure using an acidic medium, and inhibiting dendrite growth on the planarized surface of the semiconductor wafer containing at least one metal structure using a basic medium.

DETAILED DESCRIPTION

The present disclosure, which provides a post metal chemical-mechanical planarization (CMP) cleaning process for advanced interconnect technology, will now be described in greater detail by referring to the following discussion and drawings that accompany the present application. It is noted that the drawings of the present application are provided for illustrative purposes only and, as such, the drawings are not drawn to scale. In the following description, numerous specific details are set forth, such as particular structures, components, materials, dimensions, processing steps and techniques, in order to provide a thorough understanding of the present disclosure. However, it will be appreciated by one of ordinary skill in the art that the present disclosure may be practiced without these specific details. In other instances, well-known structures or processing steps have not been described in detail in order to avoid obscuring the present disclosure.

In the present disclosure, a cleaning process, which is conducted after chemical-mechanical planarization of a semiconductor wafer containing a metal structure, is provided. A first step of the cleaning process of the present disclosure comprises a brush clean in the presence of an acidic medium which can dissolve and remove metal oxide particles, such as, for example, copper oxide particles, from the polished surface of a semiconductor wafer. As a result of removing the metal oxide particles from the polished surface of the semiconductor wafer, this step of the present disclosure reduces and, in some instances, eliminates circular ring defects, which typically form using prior art post metal CMP cleaning processes. A second step of the cleaning process of the present disclosure, which follows the first step, includes dipping the semiconductor wafer containing the metal structure into a basic medium. The second step passivates an exposed uppermost surface of the metal structure. Moreover, the passivation prevents dendrite growth.

Reference is first made to FIGS. 2-5 which illustrates an embodiment in which a planarized interconnect structure is first formed, and then subjected to the post metal CMP cleaning process of the present disclosure. Although the description and drawings illustrate using the post metal CMP cleaning process of the present disclosure on a planarized interconnect structure, the post metal CMP cleaning process of the present disclosure can be used in other structures in which a metal layer is subjected to chemical-mechanical planarization.

Figure 2:
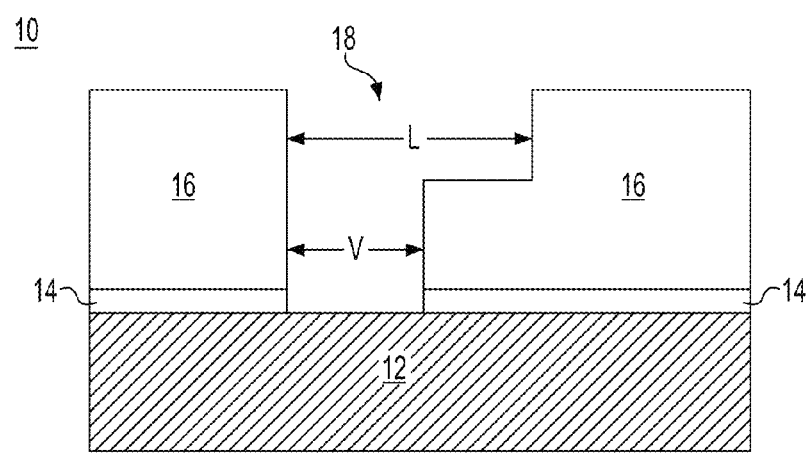
FIG. 2 is a pictorial representation (through a cross sectional view) illustrating a structure including an interconnect dielectric material having at least one opening present therein and located atop a semiconductor wafer that can be employed in one embodiment of the present disclosure.

Referring first to FIG. 2, there is illustrated a structure 10 including an interconnect dielectric material 16 having at least one opening 18 present therein and located atop a semiconductor wafer, i.e., substrate, 12 that can be employed in one embodiment of the present disclosure.

Examples of semiconductor materials that may be used as the semiconductor wafer 12 include, but are not limited to, Si, SiGe, SiGeC, SiC, Ge alloys GaAs, InAs, InP and other III/V or II/VI compound semiconductors. In one embodiment, the semiconductor wafer 12 may comprise a bulk semiconductor substrate. In another embodiment, the semiconductor wafer 12 may comprise multilayers of semiconductor materials. In yet a further embodiment of the present disclosure, the semiconductor wafer 12 may comprise a semiconductor-on-insulator substrate such as, for example, a silicon-on-insulator semiconductor (SOI) substrate or a silicon germanium-on-insulator substrate.

In some embodiments, the semiconductor material that can be employed as the semiconductor wafer 12 can be single crystalline (i.e., a material in which the crystal lattice of the entire sample is continuous and unbroken to the edges of the sample, with no grain boundaries). In another embodiment, the semiconductor material that can be employed as the semiconductor wafer 12 can be polycrystalline (i.e., a material that is composed of many crystallites of varying size and orientation; the variation in direction can be random (called random texture) or directed, possibly due to growth and processing conditions). In some embodiments of the present disclosure, the semiconductor material that can be employed as the semiconductor wafer 12 can be amorphous (i.e., a material lacking any long-range order of a crystal). Typically, the semiconductor material that can be employed as the semiconductor wafer 12 is a single crystalline semiconductor material, such as, for example, single crystalline silicon.

The semiconductor material that can be employed as the semiconductor wafer 12 may be doped, undoped or contain doped and undoped regions therein. For clarity, the doped regions are not specifically shown in the semiconductor wafer 12 illustrated in the drawings of the present disclosure. Each doped region within the semiconductor material may have the same, or they may have different conductivities and/or doping concentrations.

The semiconductor wafer 12 may be processed utilizing techniques well known to those skilled in the art to include one or more semiconductor devices such as, for example, transistors, capacitors, diodes, resistors, and BiCMOS devices. For clarity, the one or more semiconductor devices are not shown in the drawings of the present disclosure.

A blanket layer of an interconnect dielectric material is then formed atop the semiconductor wafer 12. In some embodiments, an etch stop layer 14 can be formed between the semiconductor wafer 12 and the blanket layer of interconnect dielectric material. When present, the etch stop layer 14 may comprise a dielectric material such as, for example, SiC, $Si_4NH_3$, $SiO_2$, a carbon doped oxide, a nitrogen and hydrogen doped silicon carbide SiC(N,H), silicon nitride, silicon oxynitride and multilayers thereof. The etch stop layer 14 can be formed by a deposition process including, for example, chemical vapor deposition (CVD), plasma enhanced chemical deposition (PECVD), chemical solution deposition, and evaporation. When present, the thickness of the etch stop layer 14 is from 10 nm to 75 nm. Other thicknesses that are greater than or lesser than the thickness range mentioned above can also be used for the etch stop layer 14.

The blanket layer of interconnect dielectric material may comprise any interlevel or intralevel dielectric including inorganic dielectrics or organic dielectrics. The blanket layer of interconnect dielectric material may be porous or non-porous. Some examples of suitable dielectrics that can be used as the blanket layer of interconnect dielectric material include, but are not limited to, $SiO_2$, silsesquixoanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The blanket layer of interconnect dielectric material typically has a dielectric constant that is about 4.0 or less, with a dielectric constant of about 2.8 or less being even more typical. These dielectrics generally have a lower parasitic crosstalk as compared with dielectric materials that have a higher dielectric constant than 4.0. The thickness of the blanket layer of interconnect dielectric material may vary depending upon the dielectric material used as well as the exact number of dielectrics within blanket layer of interconnect dielectric material. Typically, and for normal interconnect structures, the blanket layer of interconnect dielectric material has a thickness from about 200 to about 450 nm. The blanket layer of interconnect dielectric material may be formed utilizing a deposition process including, for example, CVD, PECVD, chemical solution deposition, evaporation and spin-on coating.

The blanket layer of interconnect dielectric material is then subjected to a single or damascene process to form interconnect dielectric material 16 having at least one opening 18 therein. A single damascene process includes lithography and etching, while a dual damascene includes an iteration of lithography and etching. Lithographic includes forming a blanket layer of photoresist material (not shown) atop the blanket layer of interconnect dielectric material, exposing the photoresist material to a desired pattern of radiation, and then developing the exposed resist. Etching may include a dry etch such as, for example, reaction ion etching, ion beam etching, plasma etching and laser ablation. During one of the etch processes used to pattern the interconnect dielectric material, or in a separate etch therefrom, at least one portion of the etch stop layer 14 that is located at a lower segment of the at least one opening 18 and beneath the now patterned interconnect dielectric material 16 can be opened, as shown in FIG. 2. The at least one opening 18 can be a via opening, a line (i.e., trench) opening, or a combined via (V) and line (L) opening as shown in FIG. 2.

Figure 3:
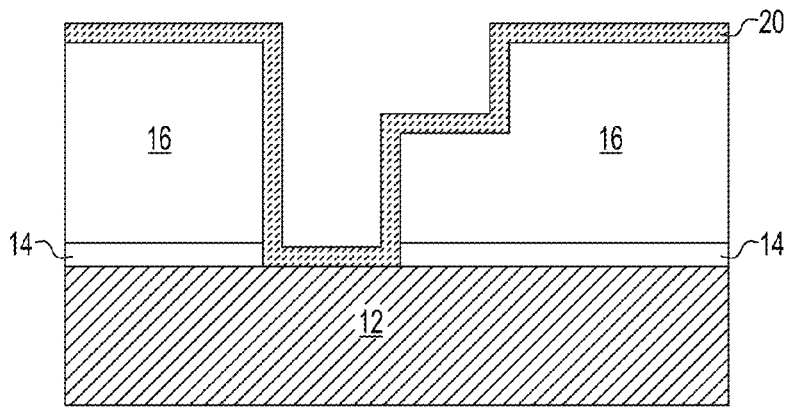
FIG. 3 is a pictorial representation (through a cross sectional view) illustrating the structure of FIG. 2 after forming a contiguous diffusion barrier liner material on exposed surfaces thereof.

Referring now to FIG. 3, there is illustrated the structure of FIG. 2 after forming a contiguous diffusion barrier liner material 20 on exposed surfaces of the structure including the uppermost surface of the interconnect dielectric material 16 and the sidewall surface of the interconnect dielectric material 16 within each opening 18. The contiguous diffusion barrier liner material 20 may comprise Ta, TaN, Ti, TiN, Ru, RuN, RuTa, RuTaN, W, WN or any other material that can serve as a barrier to prevent conductive metal atoms from diffusing there through. Combinations of these materials can also be used forming a multilayered stacked diffusion barrier liner material. The contiguous diffusion barrier liner material 20 can be formed utilizing a deposition process such as, for example, atomic layer deposition (ALD), CVD, PECVD, physical vapor deposition (PVD), and sputtering. The thickness of the contiguous diffusion barrier liner material 20 may be from 5 nm to 40 nm. Other thicknesses that are greater than or lesser than the thickness range mentioned above can also be used for the contiguous diffusion barrier liner material 20.

Figure 4:
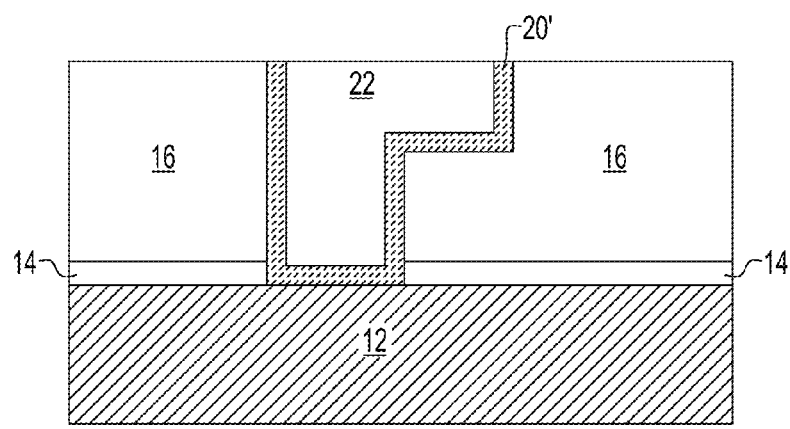
FIG. 4 is a pictorial representation (through a cross sectional view) illustrating the structure of FIG. 3 after depositing a conductive metal-containing material and performing chemical-mechanical planarization.

Referring now to FIG. 4, there is illustrated the structure of FIG. 3 after depositing a conductive metal-containing material and performing chemical-mechanical planarization. In the drawing, element 22 refers to a metal structure that comprises a remaining portion of the conductive metal-containing material after planarization, while element 20' denotes a remaining portion of the contiguous diffusion barrier liner material 20 after planarization. The remaining portion of the contiguous diffusion barrier material 20' is continuously present in the at least one opening 18. Moreover and following planarization, the uppermost surfaces of the metal structure 22 and the remaining portion of the contiguous diffusion barrier material 20' are coplanar with an uppermost surface of the interconnect dielectric material 16.

The conductive metal-containing material used in forming the metal structure 22 includes a conductive metal, an alloy comprising at least two conductive metals, a conductive metal silicide or combinations thereof. In one embodiment of the present disclosure, the conductive metal-containing material used in forming the metal structure 22 comprises Cu, W and/or Al. In yet another embodiment of the present disclosure the conductive metal-containing material used in forming the metal structure 22 comprises Cu or a Cu alloy such as, for example, AlCu. The conductive metal-containing material is filled into the remaining portions of the at least one opening 18 in the interconnect dielectric material 16 utilizing a deposition process including, but not limited to, CVD, PECVD, sputtering, chemical solution deposition and plating. When plating is used, a plating seed layer can be formed prior to plating.

After deposition, a portion of the conductive metal-containing material extends outside of the at least one opening 18 onto portions of the contiguous diffusion barrier liner material 20 that are located on the uppermost surface of interconnect dielectric material 16. This 'excess' portion of the conductive metal-containing material that extends outside of the at least one opening 18 and the portions of the contiguous diffusion barrier liner material 20 that are located on the uppermost surface of interconnect dielectric material 16 are then removed by chemical-mechanical planarization (i.e., polishing) (CMP).

CMP is performed in any conventional polishing tool and a wide variety of conditions, i.e., polishing pressure, speeds, and polishing pads, as known to those skilled in the art can be employed. Also, various polishing slurries such as, for example, an alumina-based slurry and/or a silica-based slurry can be used. The CMP process can be conducted in two steps or three steps. In either embodiment, the final step of the CMP process removes at least the portions of the contiguous diffusion barrier liner material 20 that are located on uppermost surface of interconnect dielectric material 16.

Figure 5:
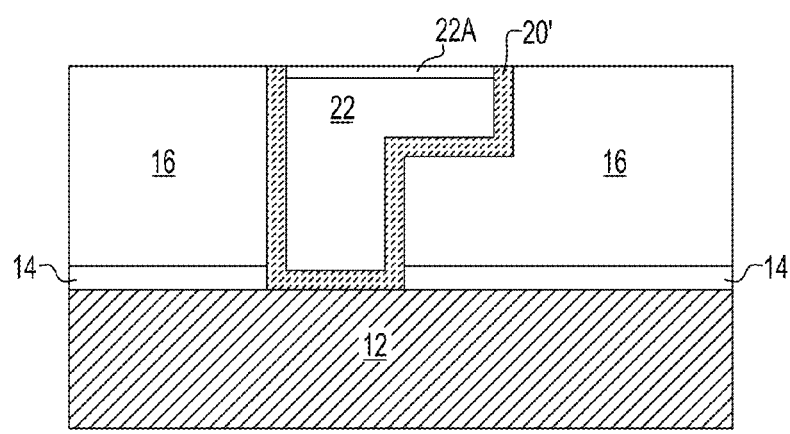
FIG. 5 is a pictorial representation (through a cross sectional view) illustrating the structure of FIG. 4 after performing the post metal CMP cleaning process of the present disclosure.

Referring now to FIG. 5, there is illustrated the structure of FIG. 4 after performing the post metal CMP cleaning process of the present disclosure. In some embodiments, the entirety of the post metal CMP cleaning process of the present disclosure may be performed in the absence of any megasonic action. In other embodiments, megasonic action can be used only during the dipping step of the post metal CMP cleaning process of the present disclosure, but not prior to, or during, the brush clean step of the post metal CMP cleaning process of the present disclosure.

The post metal CMP cleaning process of the present disclosure includes, as a first step, subjecting a planarized semiconductor wafer containing at least one metal structure (one example being the structure shown in FIG. 4) to a brush clean in an acidic medium. This brush clean may be performed once or it may be repeated any number of times. For example, the brush clean of the present disclosure may comprise a first brush clean step in a first acidic medium, and a second brush clean in a second acidic medium. The second acidic medium may be the same or different (i.e., different organic acid) from that of the first acidic medium.

The brush clean is performed in a roller brush station which includes at least one roller brush. The at least one roller brush that is used in the brush clean step of the post metal CMP cleaning process of the present disclosure comprises any conventional brush that is typically used in such post metal CMP cleaning processes. In one embodiment, the roller brush used in the brush clean step of the present disclosure is comprised of a plastic. Within the roller brush station and during the brush clean process, an acidic medium can be continuously or intermediately introduced onto the planarized surface of the semiconductor wafer containing at least one metal structure by one or more spray nozzles. The brush clean can be performed at nominal room temperature. By "nominal room temperature" it is meant a temperature from 15° C. to 40° C. Other temperatures can be employed as long as the temperature is not above the boiling point of the acidic medium. The brush clean step of the post metal CMP cleaning process of the present disclosure can be performed in an inert ambient such as, for example, $N_2$, He and/or Ar.

In some embodiments of the present disclosure, the acidic medium that can be employed in the brush clean step of the present disclosure has a pH from 2 to 5. In other embodiments of the present disclosure, the acidic medium that can be employed in the brush clean step of the present disclosure has a pH from 2 to 3. Moreover, the acidic medium that can be employed in the brush clean step of the present disclosure comprises an aqueous solution of an organic acid. In some embodiments of the present disclosure, the acidic medium may also include other components such as, for example, surfactants and/or stabilizing agents, so long as the other components do not adversely change the pH of the acidic medium from within the ranges mentioned above. In one embodiment of the present disclosure, the concentration of organic acid within the aqueous solution is from 1.0 to 20.0 weight percent, based on the entirety of the aqueous solution. In another embodiment of the present disclosure, the concentration of organic acid within the aqueous solution is from 4.0 to 8.0 weight percent, based on the entirety of the aqueous solution.

The term "organic acid" is used throughout the present disclosure to denote an organic compound with acidic properties. In general, organic acids are weak acids and do not dissociate completely in water. Any organic acid can be used in the brush clean as long as the organic acid does not etch any surface to which it is applied. In one embodiment of the present disclosure, the organic acid is a carboxylic acid which includes at least one carboxyl group, i.e., COOH. The general formula of a carboxylic acid that can be used as the acidic medium during the brush clean step of the post metal CMP cleaning process of the present disclosure is $R-(COOH)_n$, where n=is from 1 to 4, R is a functional group such as, for example an alkyl containing 1 to 12 carbon atoms or an alkyl substituted alcohol. Illustrative examples of possible R groups that can be employed in the present disclosure include, but are not limited to, $CH_3-$, $C_2H_5$, $CH_3CH_2CH_2-$, $CH_3CHCH_3CH_2-$, $CH_3CHOH-$ and $OHCH_2CHCH-$.

Examples of carboxylic acids that can be used as the acidic medium during the brush clean step of the present disclosure include, but are no limited to, lactic acid, acetic acid, formic acid, citric acid, oxalic acid, butyric acid, propanoic acid, and other highly or moderately water-soluble acids. In one embodiment of the present disclosure, citric acid is used as the acidic medium during the brush clean process.

During the brush clean in the acidic medium, metal oxide particles such as, for example, copper oxide particles are removed from the planarized surface of a semiconductor wafer containing at least one metal structure. The removal occurs by dissolving and brushing. This brush clean step also removes polish residues, foreign materials, and any other debris from the polished surface of the semiconductor wafer. In some embodiments, the brush clean step of the present disclosure can remove more than 60% of the aforementioned defects from the polished surface of the semiconductor wafer. As result of removing the above defects, especially the metal oxide particles, from the polished surface of the semiconductor wafer, there is a reduction and, in some instances, a complete elimination of formation of circular ring defects on the polished surface of the semiconductor wafer when the brush clean step of the present disclosure is employed.

Following the brush clean in an acidic medium, the polished semiconductor wafer is removed from the roller brush station and then it is dipped into a basic medium. The basic medium that is employed in the present disclosure passivates the polished surface, i.e., the metal structure 22, of the semiconductor wafer and prevents dendrite growth. In particular, the dip in the basic medium forms an insoluble $M_xO_y$ layer wherein M is a conductive metal or metal alloy as mentioned above for the conductive metal-containing material of the present disclosure. Stated in other terms, M is the same metal as that present in metal structure 22. In FIG. 5, reference numeral 22A denotes the insoluble $M_xO_y$ layer that is formed by dipping the structure shown in FIG. 4 into a basic medium. In one embodiment of the present disclosure, the insoluble $M_xO_y$ layer 22 comprises copper oxide. The insoluble $M_xO_y$ layer 22 is a continuous layer that covers an entirety of an uppermost surface of the remaining portion of the metal structure 22.

The basic medium that is used in the dipping step of the post metal CMP cleaning process of the present disclosure has a pH from 10-12. The basic medium that is employed in the dipping step of the post metal CMP cleaning process of the present disclosure comprises an aqueous solution that contains a compound with alkaline nature (i.e., a compound which when dissociated into water has a pH from 10-12). In one embodiment of the present disclosure, the concentration of the alkaline compound within the aqueous solution is from 0.5 to 10.0 weight percent, based on the entirety of the aqueous solution. In another embodiment of the present disclosure, the concentration of alkaline compound within the aqueous solution is from 1 to 2 weight percent, based on the entirety of the aqueous solution.

In one embodiment, the alkaline compound which is present within the aqueous solution may comprise tetraalkylammonium hydroxides such as, for example, tetramethylammonium hydroxide. In another embodiment of the present disclosure, the alkaline compound may comprise tetraalkylguandines such as, for example, tetramethylguandine. In yet another embodiment, the alkaline compound may comprise ammonium hydroxide. Mixtures of these alkaline compounds can also be used in the present disclosure.

The dipping step of the present disclosure may be performed any number of times, including a single dip up to multiple dips. When multiple dips are used from 2 to 10, typically from 2-5 dips, can be employed. The dipping step of the post metal CMP cleaning process of the present disclosure can be performed at nominal room temperature. By "nominal room temperature" it is meant a temperature from 15° C. to 40° C. Other temperatures can be employed as long as the temperature is not above the boiling point of the basic medium. The dipping step of the post metal CMP cleaning process of the present disclosure can be performed in an inert ambient such as, for example, He and/or Ar.

The dipping step of the post metal CMP cleaning process of the present disclosure is performed in a tank or other vessel that is capable of having one or more CMP processed semiconductor wafers immersed therein. The tank or other vessel that is employed in the present disclosure is equipped with a bleed line (for removing a quantity of basic medium from the tank) and a feed line (for introducing a quantity of basic medium into the tank). In some embodiments, the basic medium is continuously being replenished by continuously opening and closing the bleed/feed lines. In some embodiments, the CMP processed semiconductor wafer is continuously spun during the dipping step.

In some embodiments of the present disclosure, the dipping step is performed in the absence of any megasonic action. In other embodiments of the present disclosure, the dipping step of the present disclosure can be performed with megasonic action. When megasonic action is employed during the dip step, a megasonic power from 5 to 1000 W can be employed.

Following the dipping step of the post metal CMP cleaning process of the present disclosure, the semiconductor wafer including the metal structure is dried with isopropyl alcohol (IPA). The drying step can be conducted using one or more steps of contacting the semiconductor wafer including the metal structure with IPA. IPA contact may be performed at nominal room temperature (i.e., 15° C. to 40° C.) and in an inert ambient such as, for example, nitrogen, helium and/or argon.

The post metal CMP cleaning process of the present disclosure exhibits superior cleaning performance to conventional all-acidic or all-basic cleans with roller brushes. The post metal CMP cleaning process of the present disclosure combines the merits of both acidic and basic clean chemistries for the total reduction of most CMP-related defects including PR, FM, AL, SH, PS, and even HM. Moreover, the post metal CMP cleaning process of the present disclosure reduces, and in some cases totally eliminates, the circular ring defects that occur intermittently during roller brush cleans. Also, the dipping step of the post metal CMP cleaning process of the present disclosure also provides a passivation layer to the surface of the metal structure.

The following examples are provided to illustrate some aspects of the present disclosure, without limiting the scope of the present disclosure.

All the CMP work was conducted on Applied Materials' 300 mm Reflexion polishers equipped with standard megasonic tank and roller brush stations. Wafers with Cu metallization based on 32 nm and 22 nm design rules were utilized for the experiments. All wafers were polished with an alumina-based Cu slurry having a pH or about 3.0 and a silica-based barrier slurry having a pH of about 10.0 at point-of-use (POU). Various post CMP cleaning chemicals were tested in the cleaning module. Among them, chemical A is citric acid based with pH of about 2.0 at POU, while chemical B is a basic chemical with a pH of about 11.0 at POU. These chemicals were evaluated in various cleaning processes with different sequence as listed in Table 1. BR1 and BR2 refer to the cleaning steps in roller brushes 1 and 2 with chemical spray. The "rinse" (i.e., dipping) step was conducted in a tank filled with the clean chemical being constantly replenished in a bleed-and-feed cycle. During the rinse, the wafer was spinning at a constant without mechanical contact with a brush or other component. Drying was performed in isopropyl alcohol (IPA). The inventive clean process in which an acidic medium was used in both brush clean cycles and a basic medium was used in the rinse, i.e., dipping step, can also be referred to herein as a hybrid clean.

In the following discussion, PR stands for polish residues; FM stands for foreign materials; HM stands for hollow metal; and DE stands for dendrites.

TABLE 1

Cleaning processes and their process sequence

| Sequence: | 1 | 2 | 3 | 4 |
|---|---|---|---|---|
| Process | BR1 | BR2 | Rinse | IPA Drying |
| P1, prior art | Chemical A | Chemical A | n/a | Yes |
| P2, prior art | Chemical B | Chemical B | n/a | Yes |
| Inventive | Chemical A | Chemical A | B | Yes |

A: Results of All-Acidic and All-Basic Post-CMP Cleaning Processes

Figure 1:
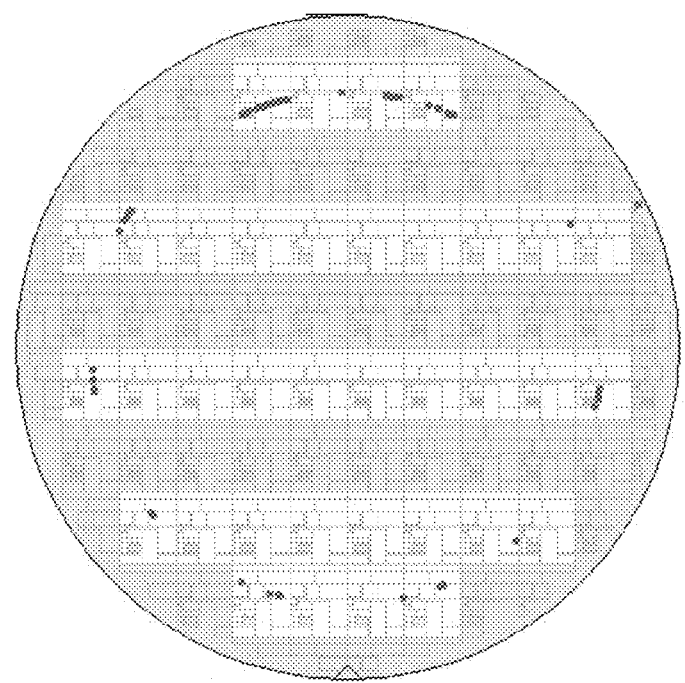
FIG. 1 shows the circular ring defects on a CMP processed semiconductor wafer containing copper interconnects that result from scrubbing during roller brush cleaning
Figure 6:
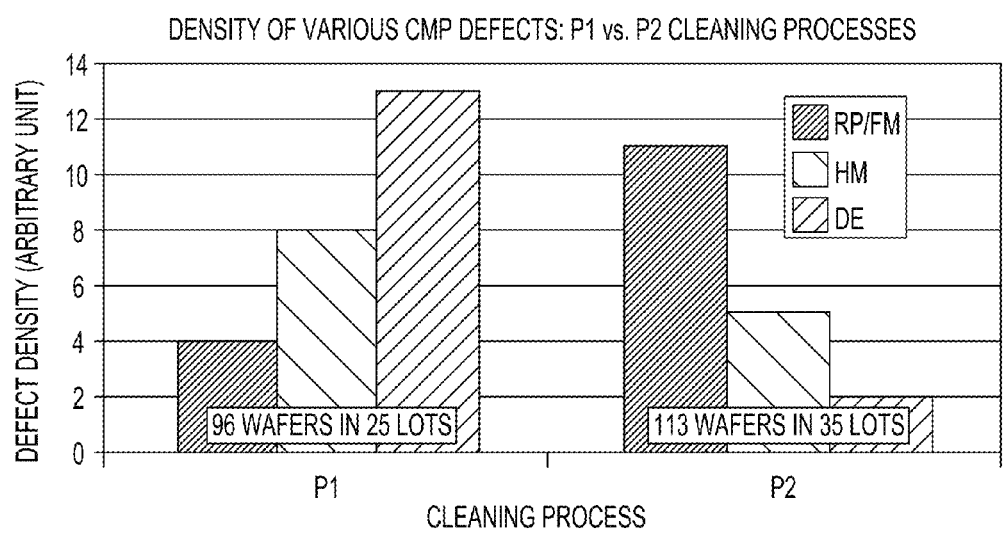
FIG. 6 is a plot showing the CMP defects for two prior art post metal CMP cleaning processes, P1 and P2.

The CMP defects generated from the P1 and P2 cleaning processes are summarized in FIG. 6. With the acidic P1 process, PR/FM defects were low, but HM and DE were high. As a consequence, extensive queue time control will need to be enforced to reduce these corrosion-related defects. On the other hand, the P2 process, with its basic chemical in both roller brushes, showed low HM and DE, but high PR/FM defects. The result suggests that, compared with the acidic P1 process, the basic chemistry in the P2 process provides better passivation of the Cu surface to prevent the formation of corrosion defects. However, there was a certain deficiency in cleaning up the PR/FM and abrasive particles in the P2 process. It was also observed that in the P1 cleaning process, no circular ring defects were detected even after thousands of wafer passes. On the other hand, circular ring defects occurred sporadically with the P2 cleaning process. The occurrence of circular ring defects, as depicted in FIG. 1, exhibited no dependence upon the lifetime (i.e., wafer passes) of the polish pad or roller brushes, nor did it correlate with the pot life of slurries or clean chemicals.

B. Performance of Clean Process of the Present Disclosure

Figure 7A:
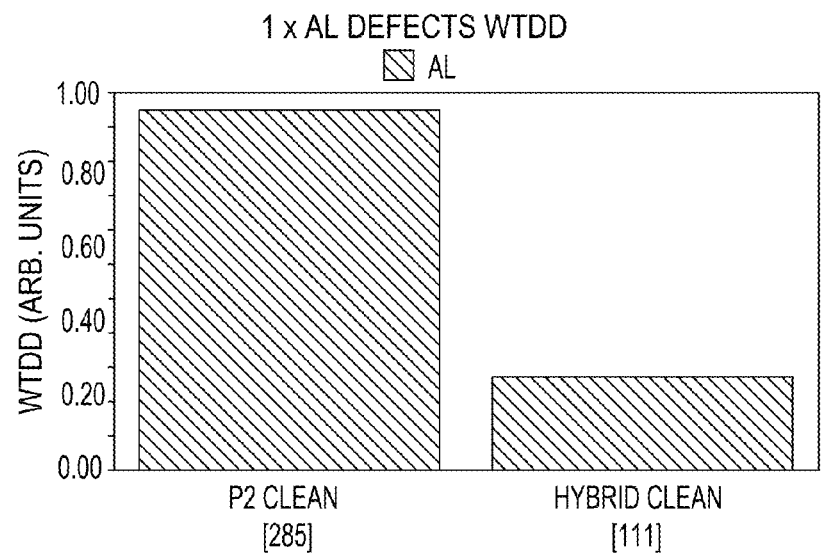
FIGS. 7A, 7B, 7C and 7D are plots showing the weighted defect density (WTDD) of major CMP-related defects between a prior art post metal CMP cleaning process P1 and the post metal CMP cleaning process of the present disclosure. Each bar denotes the mean WTDD based on more than 20 lots of data with sampling of 2 to 3 wafers per lot scanned for defect inspection and clarification.
Figure 7B:
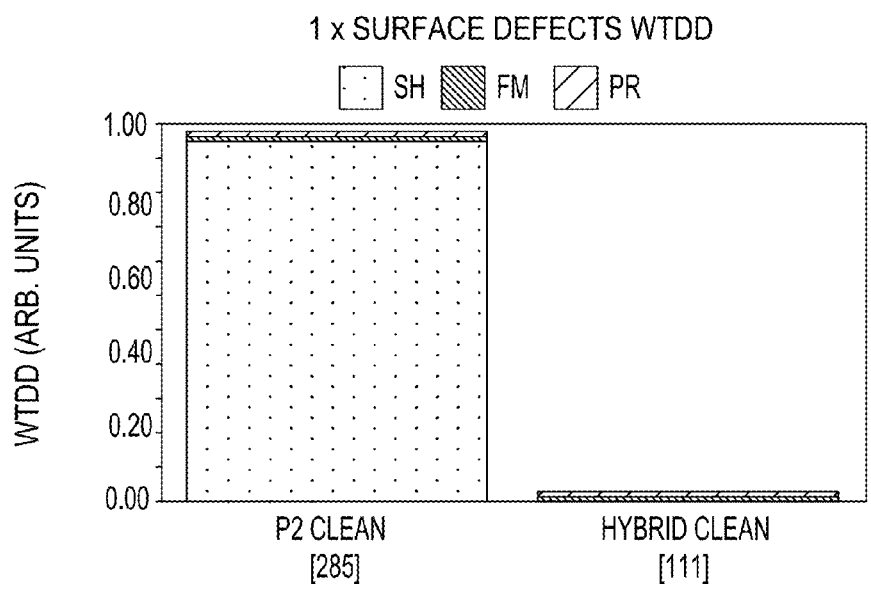
Figure 7C:
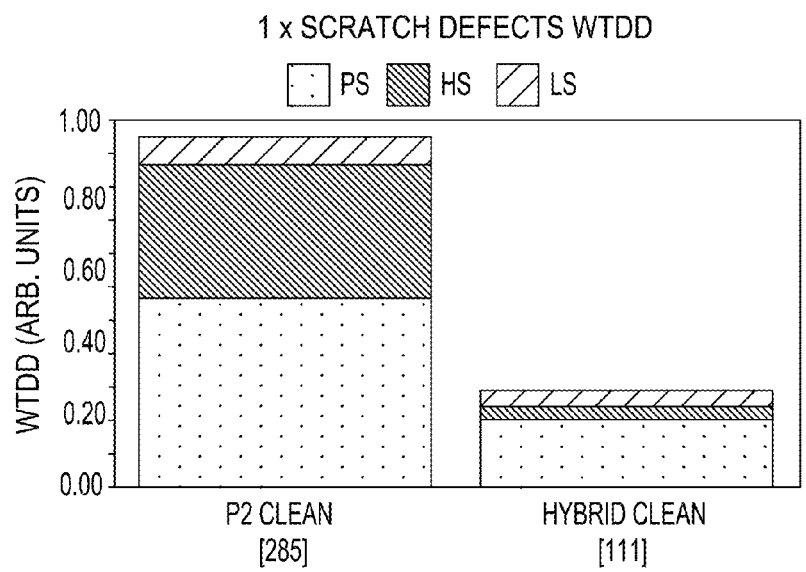
Figure 7D:
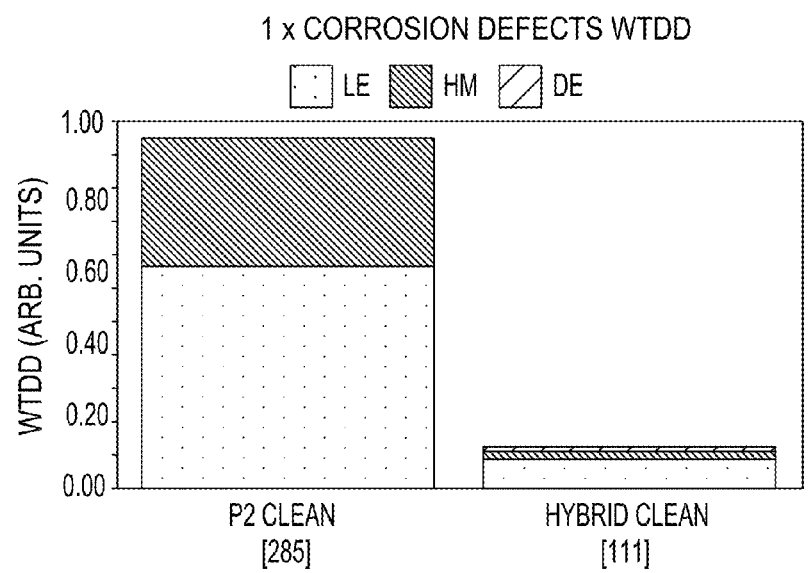

The cleaning performance of the clean process of the present disclosure in which an acidic medium is present in both brush cleans was compared with the basic P2 process in FIGS. 7A, 7B, 7C, and 7D. The remaining alumina abrasive particles (AL defects) from the Cu slurry were reduced by approximately 70% with the cleaning process of the present disclosure as shown in FIG. 7A; similarly, as demonstrated in FIG. 7B, silica abrasives (SH, from the barrier slurry), PR, and FM defects decreased remarkably with the cleaning process of the present disclosure. Even scratch defects, such as polish scratches (PS), light scratches (LS), and handling scratches (HS), and corrosion-related defects, such as HM and DE were reduced by 60% to 80%, as shown in FIGS. 7C and 7D, respectively.

Figure 8:
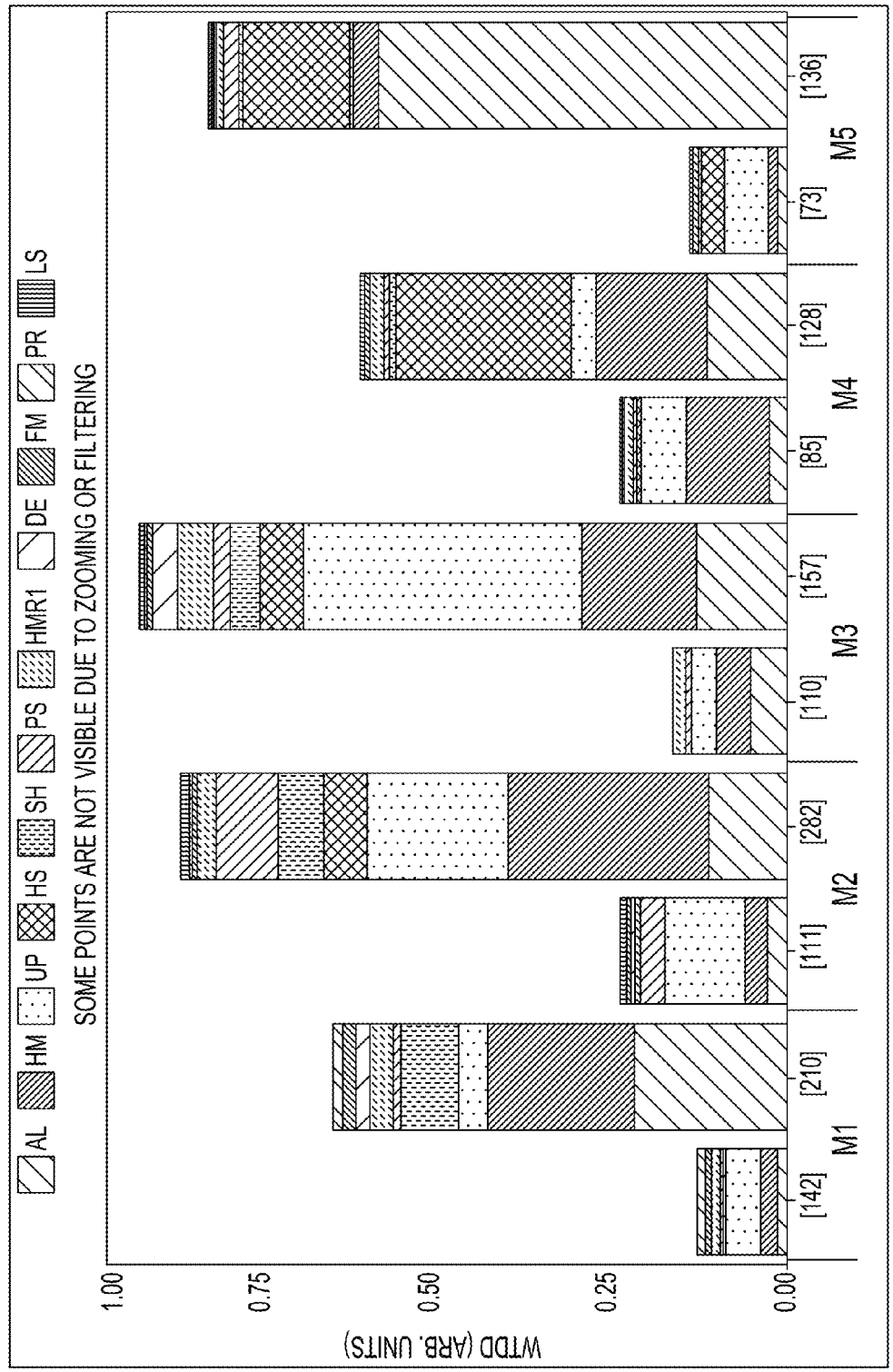
FIG. 8 is a plot showing the weighted defect density (WTDD) of CMP defects at multiple metal levels (i.e., M1, M2, M3, M4 and M5) for a prior art post metal CMP cleaning process P1 and the post metal CMP cleaning process of the present disclosure.

CMP defects from the P2 and clean process of the present disclosure were compared at multiple metal levels in FIG. 8. In FIG. 8, the first entry within each metal level represents the results using the post metal CMP cleaning process of the present disclosure, while the second entry within each metal level represents the results using P2. In this case, 300 mm wafers based on 22 nm design rule were processed with the two cleaning processes and their defect performance was monitored from metal 1 (M1) to metal 5 (M5). Over two months of data was collected and summarized in FIG. 8. The data clearly demonstrates that the clean process of the present disclosure reduces CMP defects significantly and consistently.

When using the clean process of the present disclosure, no event of circular ring defects was reported, even after 6 months of process qualification and high-volume production. Essentially, the circular ring defects had been turned off by the implementation of the brush clean step of the post metal CMP cleaning process of the present disclosure.

C. Surface Characterization

Extensive chemical and material characterization was conducted to understand the performance of the clean process of the present disclosure. Total reflection x-ray fluorescence (TXRF) was employed to determine the existence of trace metals (e.g., Al) on wafers processed with different cleaning processes. As shown in Table II, TXRFs scan revealed no difference in the Al signal on blanket Cu wafers.

TABLE 2

TXRF Al metal density on blanket and patterned wafers processed with different cleaning processes. "Edge" refers to the approximate 5 mm band on the wafer edge while "center" represents the rest of the wafer.

| Wafer and CMP cleaning process | Trace of Al by TXRF analysis Al density (arb. unit) | |
| --- | --- | --- |
|  | Center | Edge |
| a. Blanket Cu, Hybrid | 0.36 | 0.25 |
| b. Blanket Cu, P2 | 0.40 | 0.26 |
| c. Blanket Cu, ref (no CMP process) | 0.38 | 0.33 |
| d. 22 nm patterned wafer, P2 | 1.23 | 100.00 |
| e. 22 nm patterned wafer, Hybrid | 0.48 | 5.46 |

Al density on wafers processed with P2 and clean process of the present disclosure were about the same as that from the reference wafer, i.e., as plated and annealed without a CMP process. However, on 22 nm patterned wafers, significantly higher Al density was detected, especially within a band 5 mm in from the wafer edge. In this case, the clean process of the present disclosure reduced the Al signal by up to 20 times compared with the P2 process.

SEM inspection and energy dispersive x-ray spectroscopy (EDX) analysis were performed to determine the nature of the high concentration of Al on the wafer edge. This analysis revealed that the high Al signal was the result of $AlO_x$ abrasive particles embedded in the dummy patterns on the wafer edge.

X-ray photoelectron spectroscopy (XPS) spectra on wafers processed with P2 and the clean process of the present disclosure was performed. There was no distinguishable difference in the Cu surface state between the P2 and clean process of the present disclosure. Their spectra overlapped, both showing distinctive Cu peaks at 932.5 eV ($2p_{3/2}$) and 952.3 eV ($2p_{1/2}$). After about 48 hours of exposure to the ambient lab environment, both samples grew small amount of surface oxide and their $2p_{3/2}$ and $2p_1/2$ peaks shifted slightly to higher binding energy. However, the difference between their surface oxidation states was indiscernible based on the spectra. The result suggests that the two cleaning processes passivate the Cu surface equally well.

Surface roughness was determined by scanning tunneling microscopy (STM) on a 10 μm×10 μm Cu pad area. From this analysis it was determined that a wafer processed with the clean process of the present disclosure showed slightly higher Cu surface roughness than the one with basic P2 process, suggesting a slightly stronger surface etching component in the cleaning process of the present disclosure. Without being bound by any theory, difference in surface roughness was, presumably due to the presence of acidic clean chemical (Chemical A) in the roller brushes.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed as new is:

1. A method of processing a semiconductor wafer comprising:
    planarizing a semiconductor wafer containing at least one metal structure;
    subjecting the semiconductor wafer to brush cleaning in an acidic medium and in a roller brush station including at least one roller brush; and
    dipping the semiconductor wafer in a basic medium, wherein said dipping is performed by continuously spinning of said semiconductor wafer and in the absence of mechanical contact with a brush or other component to provide a continuous insoluble metal-containing oxide layer over the entirety of the at least one metal structure.

2. The method of claim 1, wherein said acidic medium has a pH from 2 to 5.

3. The method of claim 2, wherein said acidic medium comprises an organic acid.

4. The method of claim 3, wherein said carboxylic acid is selected from one of lactic acid, acetic acid, formic acid, citric acid, oxalic acid, butyric acid, and propanoic acid.

5. The method of claim 2, wherein said organic acid is citric acid.

6. The method of claim 1, wherein said basic medium has a pH from 10-12.

7. The method of claim 6, wherein said basic medium is selected from one of tetramethylammonium hydroxide, tetramethylguandine, and ammonium hydroxide.

8. The method of claim 1, wherein said acidic medium dissolves and removes metal oxides from a planar surface of said semiconductor wafer.

9. The method of claim 8, wherein said dipping in said basic medium passivates said planar surface of said semiconductor wafer.

10. The method of claim 1, wherein no megasonic action is performed prior to, or during said brush clean.

11. A method to eliminate metal defects and inhibit dendrite growth on a planarized semiconductor wafer comprising:
    removing metal oxide particles from a planarized surface of a semiconductor wafer containing at least one metal structure, wherein said removing comprises subjecting the semiconductor wafer to brush cleaning in an acidic medium and in a roller brush station including at least one roller brush; and
    inhibiting dendrite growth on the planarized surface of the semiconductor wafer containing at least one metal structure by dipping the wafer into a basic medium, wherein said dipping is performed by continuously spinning of said semiconductor wafer and in the absence of mechanical contact with a brush or other component to provide a continuous insoluble metal-containing oxide layer over the entirety of the at least one metal structure.

12. The method of claim 11, wherein said acidic medium has a pH from 2 to 5.

13. The method of claim 12, wherein said acidic medium comprises an organic acid.

14. The method of claim 13, wherein said organic acid is selected from one of lactic acid, acetic acid, formic acid, citric acid, oxalic acid, butyric acid, and propanoic acid.

15. The method of claim 12, wherein said organic acid is citric acid.

16. The method of claim 11, wherein said basic medium has a pH from 10-12.

17. The method of claim 16, wherein said basic medium is selected from one of tetramethylammonium hydroxide, tetramethylguandine, and ammonium hydroxide.

18. The method of claim 11, wherein said removing the metal oxide particles comprises dissolving and brushing.

19. The method of claim 11, wherein said metal oxide particles comprises copper oxide particles.

20. The method of claim 11, wherein no megasonic action is performed prior to, or during said removing the metal oxide particles.

* * * * *